United States Patent
Lee et al.

(10) Patent No.: US 6,664,172 B2
(45) Date of Patent: Dec. 16, 2003

(54) METHOD OF FORMING A MOS TRANSISTOR WITH IMPROVED THRESHOLD VOLTAGE STABILITY

(75) Inventors: Tong-Hsin Lee, Taipei Hsien (TW); Chung-Yi Chen, Taipei Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 47 days.

(21) Appl. No.: 09/683,578

(22) Filed: Jan. 22, 2002

(65) Prior Publication Data

US 2003/0139025 A1 Jul. 24, 2003

(51) Int. Cl.[7] ............................................. H01L 21/425
(52) U.S. Cl. ....................... 438/528; 438/527; 438/706
(58) Field of Search ................................. 438/528, 706, 438/689, 707, 527

(56) References Cited

U.S. PATENT DOCUMENTS

| | | | | |
|---|---|---|---|---|
| 5,814,545 A | * | 9/1998 | Seddon et al. | 438/303 |
| 5,879,986 A | * | 3/1999 | Sung | 438/253 |
| 6,180,453 B1 | * | 1/2001 | Sung et al. | 438/256 |
| 6,403,432 B1 | * | 6/2002 | Yu et al. | 438/296 |
| 6,468,915 B1 | * | 10/2002 | Liu | 438/706 |

OTHER PUBLICATIONS

IBM Technical Disclosure Bulletin "New Barrier for H+ diffusion into solid substrates" Jan. 1991.*

* cited by examiner

Primary Examiner—Richard Elms
Assistant Examiner—Brad Smith
(74) Attorney, Agent, or Firm—Winston Hsu (57) ABSTRACT

The gate for at least one transistor is formed on the surface of the semiconductor substrate and the gate is utilized as a mask to form a lightly doped drain of the transistor. A low thermal budget deposition process is performed to form a silicon nitride layer on the surface or the semiconductor substrate. An ion implantation process is performed to implant fluorine atoms into the silicon nitride layer. After that, an etching process is performed to form a spacer in the periphery of the gate. Finally, a source/drain of the transistor is formed. The implanted fluorine atoms bond with the hydrogen atoms and keep them from becoming interface trapped charges. This increases the threshold voltage stability of the transistor.

19 Claims, 10 Drawing Sheets

METHOD OF FORMING A MOS TRANSISTOR WITH IMPROVED THRESHOLD VOLTAGE STABILITY

BACKGROUND OF INVENTION

1. Field of the Invention

The present invention relates to a method of forming a metal-oxide-semiconductor (MOS) transistor, and more particularly, to a method of improving the threshold voltage stability of a MOS transistor.

2. Description of the Prior Art

In today's electronics industry, semiconductors are the most extensively used devices. Previous developments such as the PN diode and the bipolar junction transistor (BJT) showed how electronic devices could make use of the unique characteristics of semiconductor materials. Because semiconductors are solid-state devices, it has been possible to shrink them to incredibly small sizes, and the drive towards miniaturization has led the semiconductor industry to progress rapidly in the past few years. Most recently, transistors known as metal-oxide semiconductor (MOS) transistors have been created that consume less power and can be highly integrated. These tiny transistors have gradually replaced the BJT, and are widely used in various electronic devices and logic circuits.

The progress of the science and technology has led to continual improvements in the performance of electronic devices and logic circuits. These improvements have fueled the increased demand for MOS transistors. In a MOS transistor, one of the most basic and critical requirements for proper operation is a stable threshold voltage. If the threshold voltage of a MOS transistor is unstable or out of spec, the turn-on and turn-off of the MOS transistor become abnormal and further affect the accuracy of the operation of integrated circuit. Not only does one need to satisfy the demand of a stable threshold voltage, but also demands of other electrical characteristics, such as turn-on speed, power dissipation, and leakage current.

Figure 1:
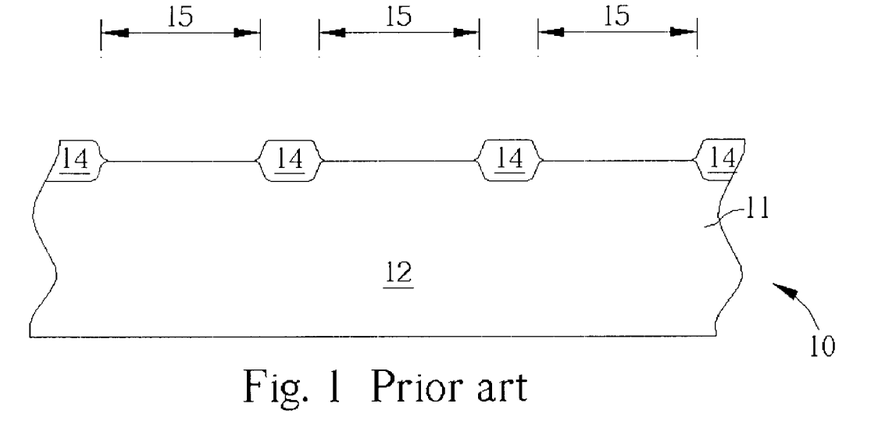
FIG. 1 through FIG. 4 are schematic diagrams of the formation of a MOS transistor 38 according to the prior art method.

Please refer to FIG. 1 through FIG. 4. FIG. 1 through FIG. 4 are schematic diagrams showing the formation of a MOS transistor 38 according to the prior art method. As shown in FIG. 1, a prior art MOS transistor 38 is made on a semiconductor wafer 10. The semiconductor wafer 10 comprises a semiconductor substrate 11, a P-well 12 on the semiconductor substrate 11, and a plurality of isolators 14 positioned on the surface of the P-well 12. The isolator 14 is usually a field oxide layer formed by a oxidation (LOCOS) or a shallow trench isolation (STI), and is used to define an active area 15 for each MOS transistor.

Figure 2:
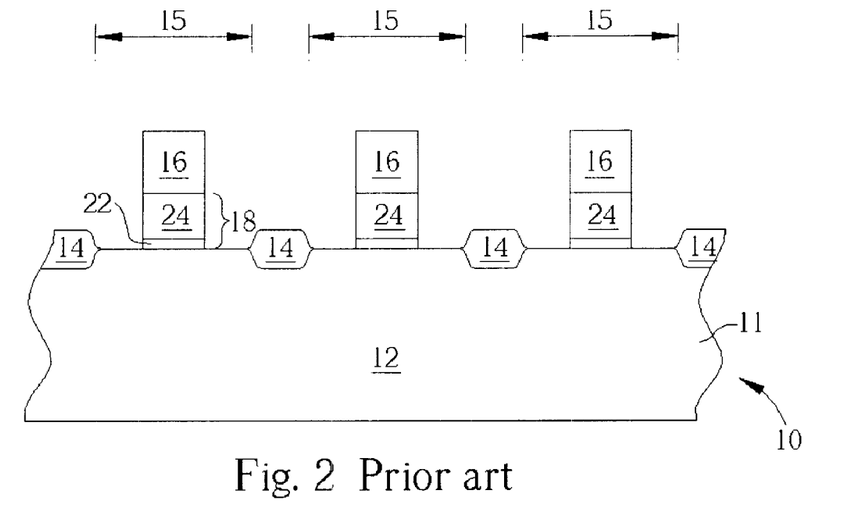

As shown in FIG. 2, a thermal oxidation process and a low pressure chemical vapor deposition (LPCVD) process are performed to homogeneously and sequentially form a silicon dioxide layer ($SiO_2$ layer, not shown) and a doped polysilicon layer (not shown) on the surface of the semiconductor wafer 10. Then a first photoresist layer 16 is coated on the surface of the semiconductor wafer 10. This is followed by a photolithography process to define the pattern of each gate 18 in the photoresist layer 16. Thereafter a dry etching process is performed to form the gate 18, which comprises a gate oxide layer 22 and a gate conductive layer 24, on the surface of the semiconductor wafer 10. Finally, the photoresist layer 16 is removed.

Figure 3:
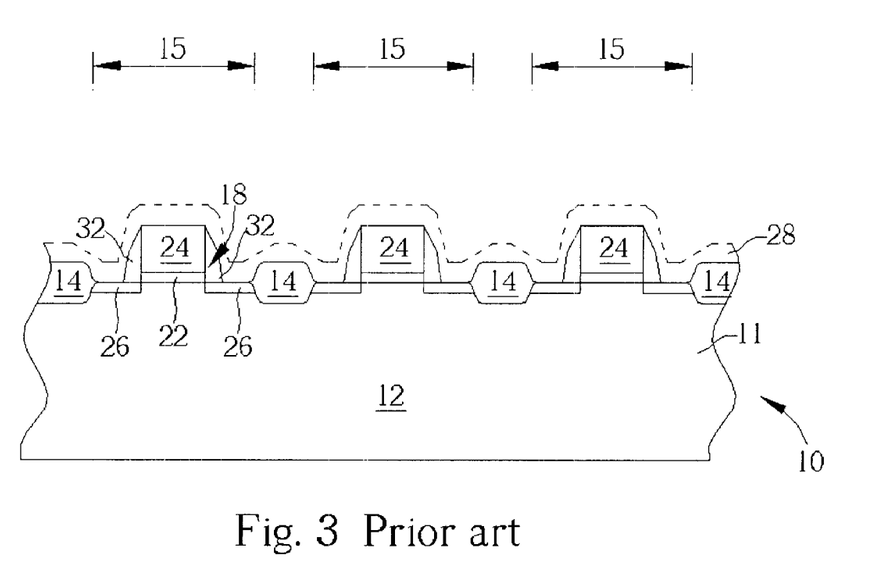

As shown in FIG. 3, the next step is to perform an ion implantation process to form a lightly doped drain (LDD) 26 at either side of the transistor gate 18. A chemical vapor deposition (CVD) process is then performed to deposit a silicon nitride layer 28 on the surface of the semiconductor wafer 10, and an anisotropic dry etching process is performed to remove the silicon nitride layer 28 down to the surface of the p-well 12 so as to form a spacer 32 on each lateral side of the gate 18. The CVD process, being a low thermal budget process, is characterized as a low deposition temperature process. It is usually performed in a single wafer type chamber for plasma enhanced chemical vapor deposition (PECVD) processes at a reaction temperature less than 450° C. Or it is performed in a single wafer type chamber or a batch type chamber for chemical vapor deposition (CVD) process at a reaction temperature ranging from 600 to 700° C.

Thus, avoid an unexpected drive-in of the dopants in the lightly doped drain 26 due to high temperature, which would further alter the profile of the lightly doped drain 26 and affect the operational speed and power dissipation of the MOS transistor 38. Since the silicon nitride layer 28 is characterized as a high tensile stress layer, cracks in this layer are readily produced. The tensile stress of the silicon nitride layer can be lowered by adjusting the radio frequency power in the PECVD process to control the bombardment of ions to deposited film. Or, a silicon dioxide layer, being a linear oxide layer having a lower tensile stress, can be deposited or grown before depositing the silicon nitride layer, and can be used as a buffer layer for improving the adhesion between the silicon nitride layer and the silicon surface. It is worth noticing that the growth reaction, which is a rapid thermal processing (RTP), having a high process temperature and a short reaction time, is characterized as a low thermal budget process. Therefore, there will be no impact on the formed lightly doped drain.

Figure 4:
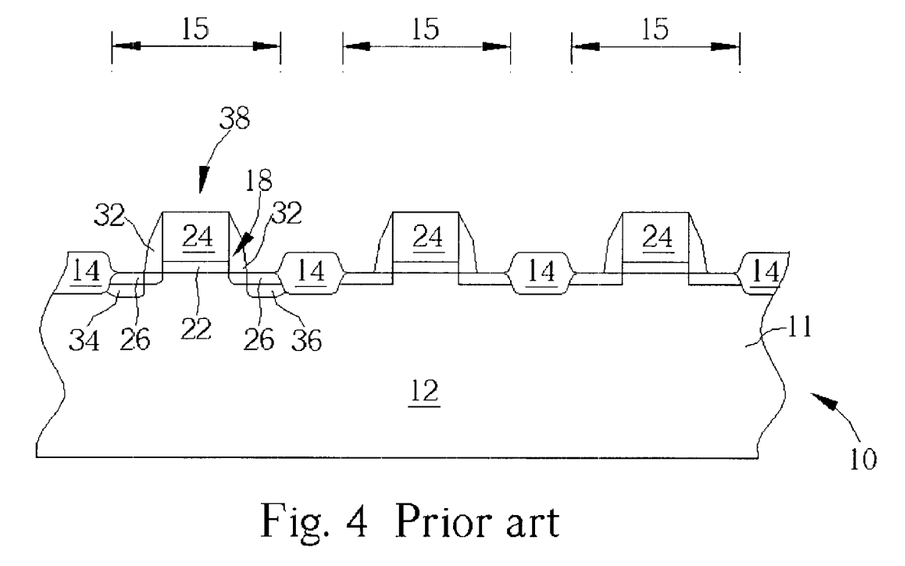

As shown in FIG. 4, another ion implantation process is thereafter performed by utilizing the gate 18 and the spacer 32 as a hard mask to implant N-type dopants into the P-well 12 at either side of the spacer 32 so as to form a source 34 and drain 36 of the MOS transistor. The semiconductor wafer 10 is then put into a furnace and a drive-in process is performed to diffuse the dopants to expected profile and complete the MOS transistor 38.

Figure 5:
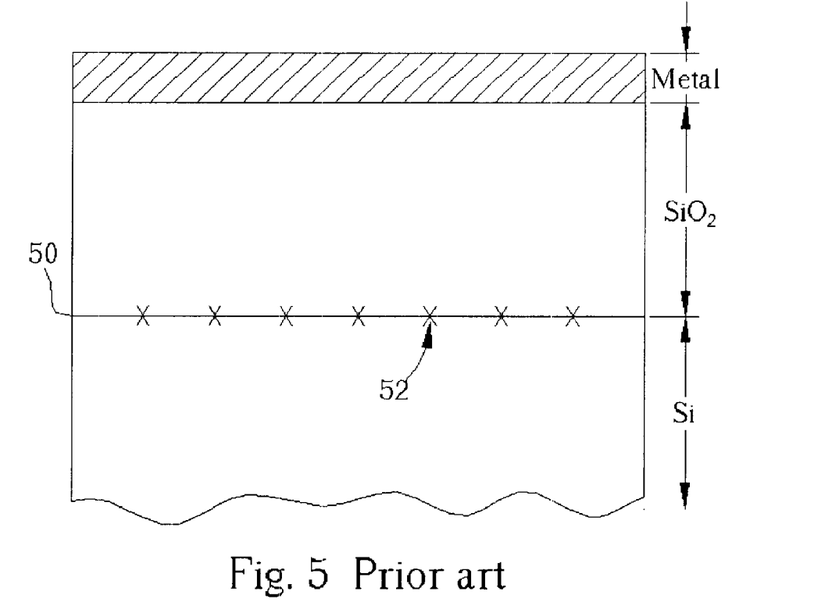
FIG. 5 is a schematic diagram of interface trapped charges resulted from the low thermal budget chemical vapor deposition process for forming the spacer according to the prior art.

However, there is a problem with the prior art method for forming the MOS transistor. Please refer to FIG. 5, FIG. 5 is a schematic diagram of interface trapped charges 52 resulting from the low thermal budget chemical vapor deposition process for forming the spacer 32 according to the prior art. The silicon nitride deposited by the PECVD process contains an amount of hydrogen (H) from 7~30%, depending on the process parameters. The hydrogen content comes from Si—H bonds and N—H bonds, which form when a precursor with a low dissociation temperature loses hydrogen atoms to unsaturated silicon (S) and nitrogen (N) atoms during the low thermal budget chemical vapor deposition process. The diffusion velocity of hydrogen atoms is rapid due to their small size. As a result, the hydrogen atoms near the gate are readily diffused into the Si—$SiO_2$ interface 50. Owing to the discontinuous property of the Si—$SiO_2$ interface, H atoms are trapped into the Si—$SiO_2$ interface and become interface-trapped charges ($Q_{it}$) 52, as shown in FIG. 5. In addition, $Q_{it}$ are dependent on the chemical composition of the Si—$SiO_2$ interface. The interface trap density (i.e., number of interface traps per unit area) can be reduced by both using adequate annealing process and selecting wafers with low traps, such as the <100> oriented silicon wafer. However, interface traps cannot be eliminated completely.

For any MOS transistor, the threshold voltage ($V_t$) is the smallest gate voltage required for the onset of strong inversion on the surface of a semiconductor. This is given by $$V_t = V_{FB} + Q_B/C_{OX} + 2\phi_B$$

where $V_{FB}$ denotes the flat band voltage, $Q_B$ denotes the charge density contained within the surface depletion region at the onset of strong inversion, $C_{OX}$ denotes the capacitance of the oxide layer, and $\phi_B$ denotes the bulk potential of the semiconductor. Due to the existence of the interface-trapped charges, the magnitude of the flat band voltage is changed, and as a result, the magnitude of the threshold voltage is changed. The above description uses the example of an NMOS transistor made on a P-type substrate with positive interface-trapped charges. However, it is also possible to have a PMOS transistor made on an N-type substrate. The interface-trapped charges can be negative or positive for both PMOS and NMOS transistor. Transistors made of different materials with different interface-trapped charges will have correspondingly different flat band voltages and threshold voltages.

When process control is poor, the uniformity of hydrogen atoms concentration is difficult to be controlled. This circumstance occurs in within wafer, wafer to wafer and lot to lot. As a result, the threshold voltage uniformity ($V_t$ uniformity) in within wafer, wafer to wafer and lot to lot are difficult to be controlled. It is therefore very important to develop a method of forming a MOS transistor that forms the silicon nitride spacer with low thermal budget process and inhibits the hydrogen atoms from diffusing to the Si—SiO$_2$ interface to improve the stability of threshold voltage.

SUMMARY OF INVENTION

It is therefore a primary objective of the present invention to provide a method of forming a MOS transistor in a way that improves the stability of threshold voltage.

According to the claimed invention, the gate for at least one transistor is formed on the surface of the semiconductor substrate and a lightly doped drain of the transistor is formed by utilizing the gate as a mask. A low thermal budget deposition process is then performed to form a silicon nitride layer on the surface of the semiconductor substrate. An ion implantation process is thereafter performed to implant fluorine atoms into the silicon nitride layer. After that an etching process is performed to form a spacer in the periphery of the gate. Finally, a source/drain of the transistor is formed It is an advantage of the present invention that the method of forming the MOS transistor is to deposit a silicon nitride layer, with a low thermal budget chemical vapor deposition process, after forming the lightly doped drain. Then perform a blanket ion implantation process to implant fluorine atoms into the silicon nitride layer. Finally form the spacer of the transistor. The inclusion of the blanket ion implantation step means that the hydrogen atoms in the silicon nitride layer are captured by the implanted fluorine atoms. As a result, the rapidly diffusing hydrogen atoms are fixed in their original locations and do not readily to diffuse to the Si—SiO$_2$ interface, effectively reducing the interface trap density of the Si—SiO$_2$ interface. The threshold voltage stability of the MOS transistor is greatly improved because the magnitude of the flat band voltage is not readily changed. In addition, the expected profile of the lightly doped drain is kept, so the operational speed and power consumption of device are not affected by the process of forming the spacer. These and other objectives of the present invention will no doubt become obvious to those of ordinary skill in the art after reading the following detailed description of the preferred embodiment, which is illustrated in the various figures and drawings.

DETAILED DESCRIPTION

Figure 6:
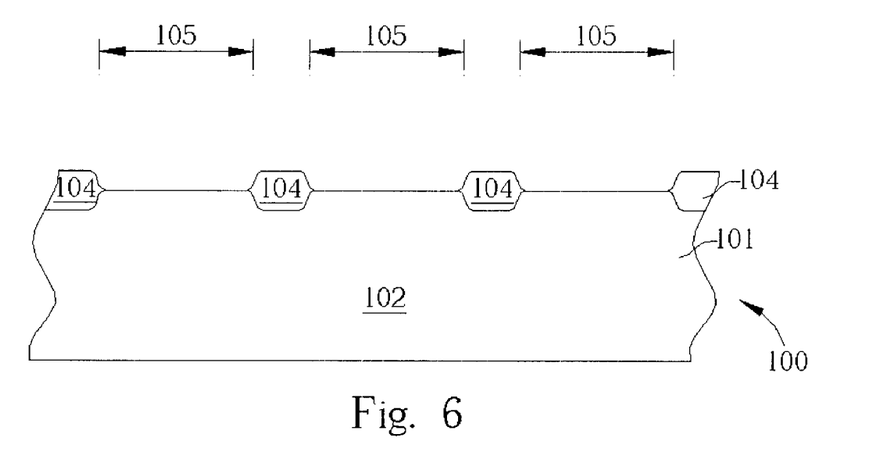
FIG. 6 to FIG. 10 are schematic diagrams of forming a MOS transistor according to the present invention.

Please refer to FIG. 6 through FIG. 10, FIG. 6 through FIG. 10 are schematic diagrams of the formation of a MOS transistor 128 according to the present invention. As shown in FIG. 6, the present invention MOS transistor is made on a semiconductor wafer 100. The semiconductor wafer 100 comprises a semiconductor substrate 101, a P-well 102 on the semiconductor substrate 101, and a plurality of isolators 104 located on the surface of the P-well 102. The isolator 104 is usually a field oxide layer formed by a local oxidation (LOCOS) or a shallow trench isolation (STI), and is used to define an active area 105 for each MOS transistor 128.

Figure 7:
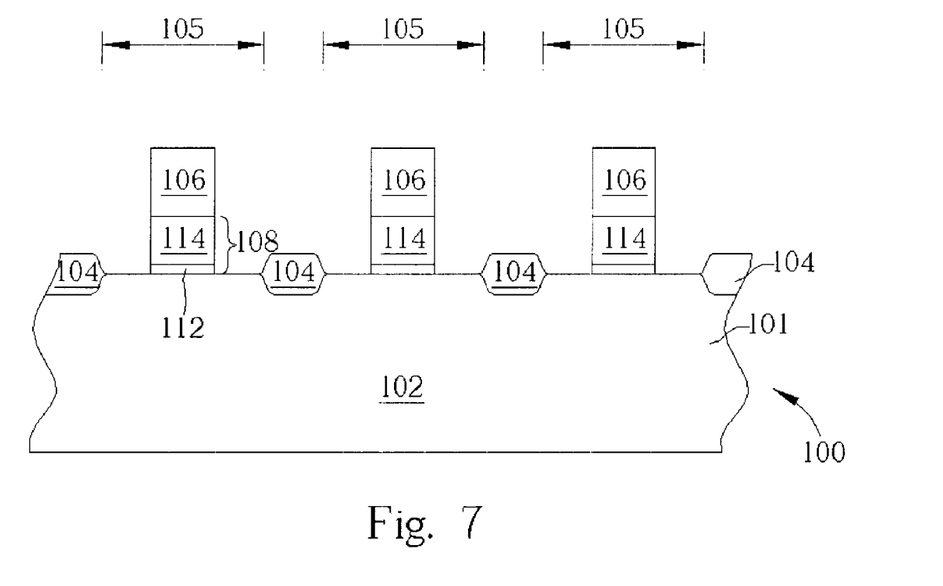

As shown in FIG. 7, a thermal oxidation process and a low pressure chemical vapor deposition (LPCVD) process are performed to homogeneously and sequentially form a silicon dioxide layer (SiO$_2$ layer, not shown) and a doped polysilcion layer (not shown) on the surface of the semiconductor wafer 100. Then a first photoresist layer 106 is coated on the surface of the semiconductor wafer 100. This is followed by a photolithography process to define the pattern of each gate 108 in the photoresist layer 106. Thereafter a dry etching process is performed to form the gate 108, which comprises a gate oxide layer 112 and a gate conductive layer 114, on the surface of the semiconductor wafer 100. Finally, the photoresist layer 106 is removed.

Figure 8:
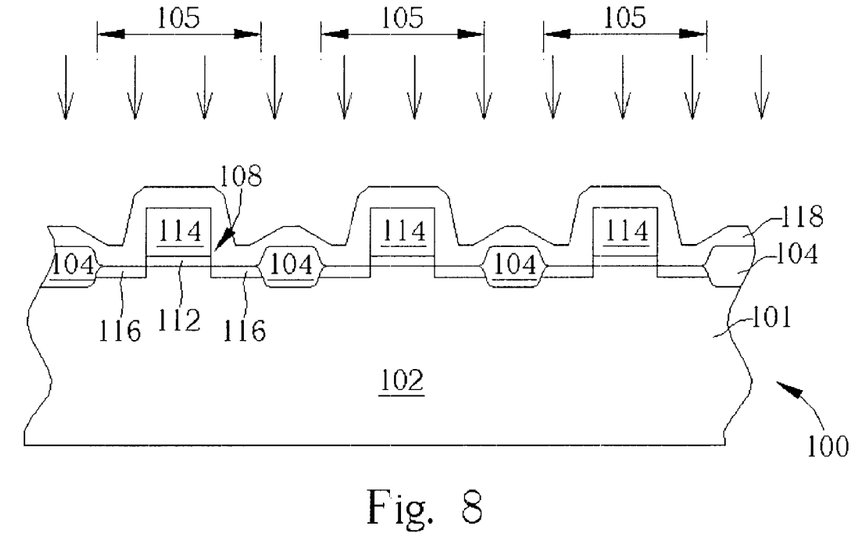

As shown in FIG. 8, the next step is to perform a first ion implantation process to form a lightly doped drain (LDD) 116 at either side of the transistor gate 108. A low thermal budget chemical vapor deposition (CVD) process is then performed to deposit a silicon nitride layer 118 on the surface of the semiconductor wafer 100. The low thermal budget CVD process is characterized as a low deposition temperature process. It is usually performed in a single wafer type chamber for plasma enhanced chemical vapor deposition (PECVD) processes at a reaction temperature less than 450° C. Or it is performed in a single wafer type chamber or a batch type chamber for chemical vapor deposition (CVD) process at a reaction temperature ranging from 600 to 700° C.

Since the silicon nitride layer 118 is characterized as a high tensile stress layer, cracks in this layer are readily produced. The tensile stress of the silicon nitride layer can be lowered by adjusting the radio frequency power in the PECVD process to control the bombardment of ions to deposited film. Or a silicon dioxide layer, being a linear oxide layer with lower tensile stress, can be deposited or grown before depositing the silicon nitride layer. The silicon dioxide layer would then be used both as a buffer layer for improving the adhesion between the silicon nitride layer and the silicon surface and as a stop layer during the etching process for etching the silicon nitride layer. It is worth noticing that the growth reaction, which is a rapid thermal processing (RTP), having a high process temperature and a short reaction time, is characterized as a low thermal budget process. Therefore, there will be no impact on the formed lightly doped drain.

Figure 9:
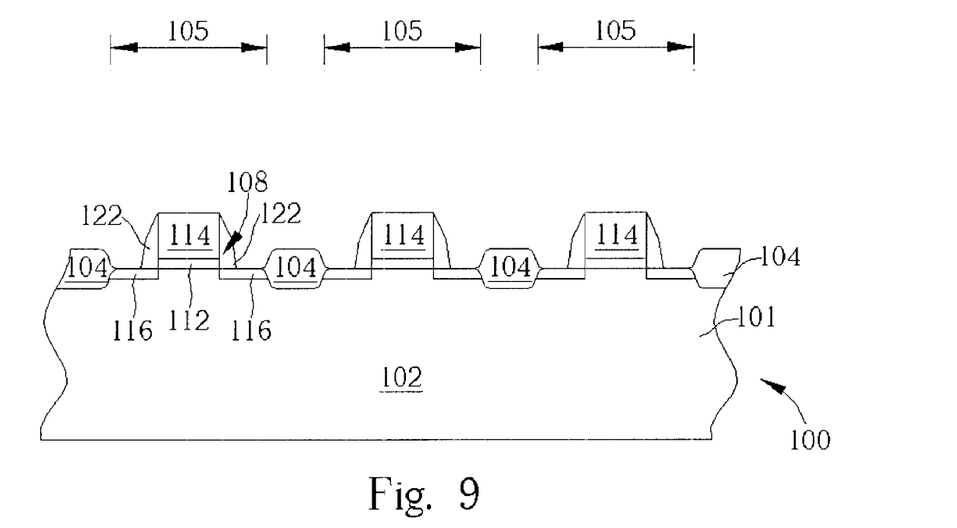

A blanket ion implantation process is thereafter performed to implant fluorine atoms into the silicon nitride layer 118. The dosage of the fluorine atom implantation process ranges from 5E13 to 5E14/cm$^2$ and the energy of the fluorine atom implantation process ranges from 2 to 5 KeV. As shown in FIG. 9, an anisotropic dry etching process is then performed to remove the silicon nitride layer 118 down to the surface of the p-well 102 so as to form a spacer 122 on each lateral side of the gate 108. The silicon nitride layer deposited by the PECVD process has a high hydrogen (H) concentration. After the blanket ion implantation process, the implanted fluorine atoms will capture the hydrogen atoms in the silicon nitride layer to fix the rapidly diffusing hydrogen atoms in their original locations, so they do not readily to diffuse into the Si—SiO$_2$ interface. In other words, the interface trap density of the Si—SiO$_2$ interface is effectively reduced. In addition, the primary objective of the blanket ion implantation process with fluorine atoms as dopants is to dehydrogenate the silicon nitride layer. Therefore any other dehydrogenation process may be utilized to replace the blanket ion implantation process of the present invention.

Figure 10:
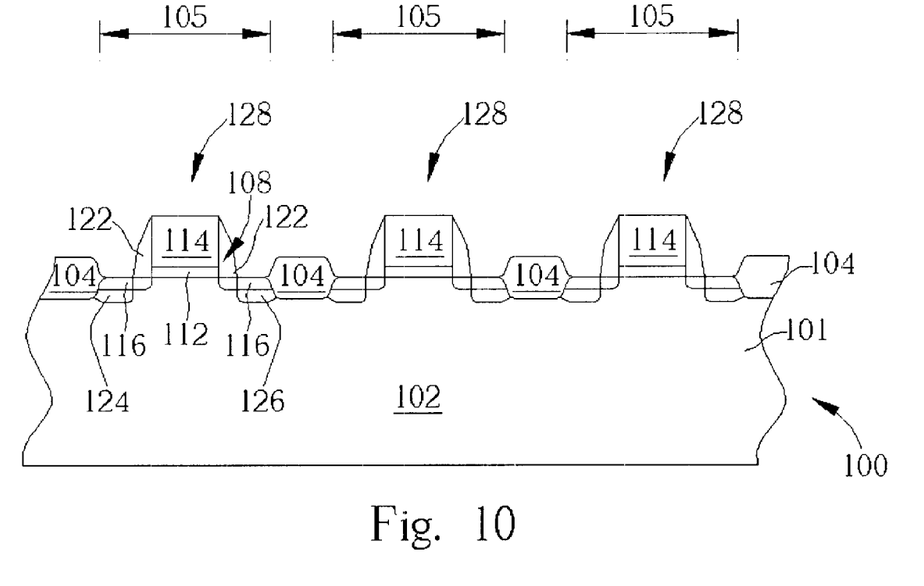

As shown in FIG. 10, a second ion implantation process is then performed by utilizing gate 108 and spacer 122 as a hard mask to implant N-type dopants into the P-well 102 at either side of the spacer 122 so as to form a source 124 and a drain of the MOS transistor. Thereafter the semiconductor wafer 100 is put into a furnace, and a drive-in process is performed to diffuse the dopants to expected profile and complete the MOS transistor 128.

The method of forming the MOS transistor according to the present invention is to deposit a silicon nitride layer with a low thermal budget chemical vapor deposition process, implant fluorine atoms into the silicon nitride layer using a blanket ion implantation process, and then form the spacer. The use of this method means that the rapidly diffusing hydrogen atoms in the silicon nitride layer will be captured by the implanted fluorine atoms and be fixed at their original location so they do not readily diffuse into the Si—SiO$_2$ interface. In other words, the interface trap density of the Si—SiO$_2$ interface is effectively reduced. The threshold voltage stability of the MOS transistor is improved because the magnitude of the flat band voltage is not readily changed. In addition, the expected profile of the lightly doped drain is kept, which means that the operational speed and power consumption of device are not adversely affected by the process for forming the spacer.

In contrast to the prior art method of forming the MOS transistor, the present invention utilizes fluorine atoms, implanted by an ion implantation process, to capture and fix the hydrogen atoms in the spacer so as to reduce the interface trap density of the Si—SiO$_2$ interface. The flat band voltage is not readily changed, and degradation of the threshold voltage stability of the MOS transistor is avoided. Furthermore, the operational speed and power consumption of the MOS transistor is not adversely affected by this process for forming the spacer.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of making a plurality of metal-oxide-semiconductor (NOS) transistors on a semiconductor substrate, the method comprising:

forming a gate oxide layer and a polysilicon layer in that order on a surface of the semiconductor substrate;

forming a first photoresist layer on the surface of the polysilicon layer and performing a first photolithography process to define the site for at least one gate;

performing a first etching process by utilizing the first photoresist layer as a mask to remove the polysilicon layer and the gate oxide layer not covered by the first photoresist layer and form the gate of at least one transistor;

removing the first photoresist layer;

performing a first ion implantation process by utilizing the gate as a mask to forms lightly doped drain (LDD) in the semiconductor substrate at either side of the gate;

forming a silicon nitride layer (Si$_3$N$_4$ layer) on the surface of the gate and the semiconductor substrate by performing a low thermal budget process;

performing a second ion implantation process to dope fluorine (F) atoms into the silicon nitride layer;

etching the silicon nitride layer to form a spacer in the periphery of the gate; and performing a third ion implantation process by utilizing the gate and the spacer as a mask to form a source/drain (S/D) in the semiconductor substrate at either side of the gate.

2. The method of claim 1 wherein the semiconductor substrate is a silicon substrate.

3. The method of claim 1, wherein the gate oxide layer is formed by a thermal oxidation process, and a metal suicide layer is further positioned on top of the transistor gate.

4. The method of claim 1 wherein the low thermal budget process comprises a plasma enhanced chemical vapor deposition (PECVD) process or a chemical vapor deposition (CVD) process.

5. The method of claim 4 wherein a chamber for the plasma enhanced chemical vapor deposition process is a single wafer type chamber.

6. The method of claim 4 wherein a chamber for the chemical vapor deposition process comprises a single wafer type chamber or a batch type chamber.

7. The method of claim 1 wherein the energy for the second ion implantation process ranges from 2 to 5 keV, and the dosage for the second ion implantation process ranges from 5E13 to 5E14/cm$^2$.

8. The method of claim 1 wherein the method for etching the silicon nitride layer is an anisotropic dry etching process.

9. A method of making a conductive line on a substrate, the method comprising:

forming at least one conductive line on the surface of the substrate;

forming a silicon nitride layer (Si$_3$N$_4$ layer) on the surface of the conductive line by performing a low thermal budget process; and performing an ion implantation process to dope fluorine (F) atoms into the silicon nitride layer to form a spacer containing fluorine (F) at the sidewall of the conductive line.

10. The method of claim 9 further comprising a step to etch the silicon nitride layer after performing the ion implantation process.

11. The method of claim 9 wherein the energy for the ion implantation process ranges from 2 to 5 key, and the dosage for the ion implantation process ranges from 5E13 to 5E14/cm².

12. The method of claim 9 wherein the conductive line comprises a bit line or a word line.

13. A method of making a metal-oxide-semiconductor (MOS) transistor with improved threshold voltage ($V_t$) stability, the method comprising:

provinding a semiconductor substrate;

forming the gate of at least one transistor on a surface of the semiconductor substrate, the gate comprising a gate oxide layer and a conductive layer;

forming a lightly doped drain (LDD) of the transistor;

forming a silicon nitride layer $Si_3N_4$ layer) on a surface of the gate of the transistor and the semiconductor substrate by performing a low thermal budget process;

performing a dehydrogenation process on the silicon nitride layer;

etching the silicon nitride layer to form a spacer in the periphery of the gate, and forming a source/drain (S/D) of the transistor.

14. The method of claim 13 wherein the semiconductor substrate is a silicon substrate.

15. The method of claim 13 wherein the low thermal budget process comprises a plasma enhanced chemical vapor deposition (PECVD) process or a chemical vapor deposition (CVD) process.

16. The method of claim 15 wherein the chamber for the plasma enhanced chemical vapor deposition process is a single wafer type chamber.

17. The method of claim 15 wherein the chamber for the chemical vapor deposition process comprises a single wafer type chamber or a batch type chamber.

18. The method of claim 13 wherein the dehydrogenation process is a fluorine (F) atom implantation process.

19. The method of claim 18 wherein the energy for the fluorine atom implantation process ranges from 2 to 5 key, and the dosage for the fluorine atom implantation process ranges from 5E13 to 5E14/cm².

* * * * *